Dec. 4, 1962 M. E. HODGES 3,067,340
TEMPERATURE COMPENSATING TRANSISTOR SWITCHING CIRCUIT WITH "SNAP-ACTION" RESPONSE
Filed May 2, 1960
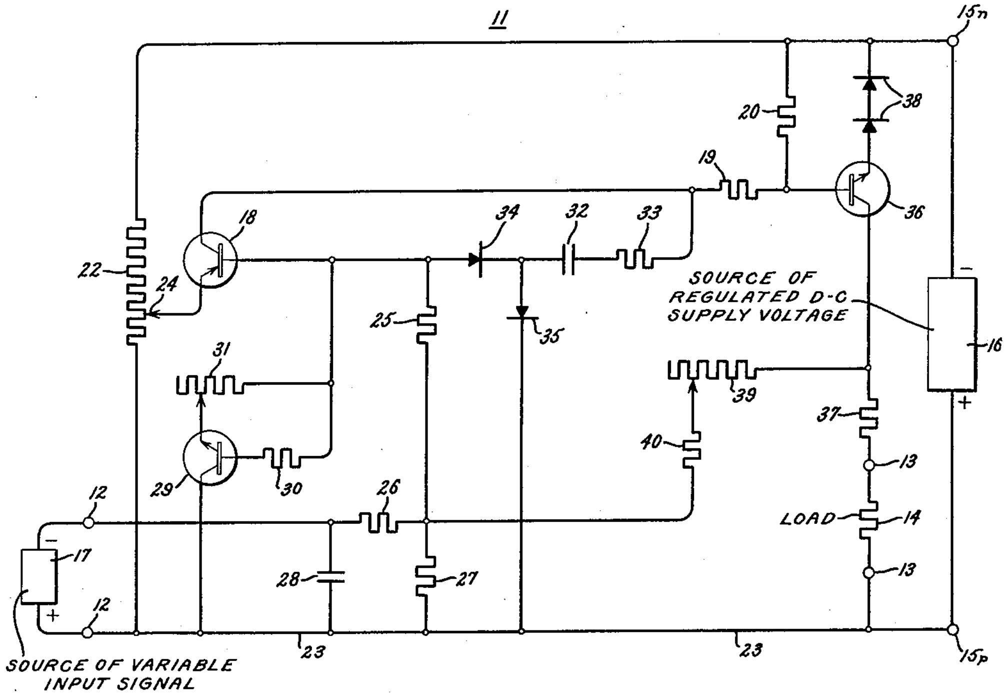
Inventor:
Merwyn E. Hodges,
by Albert S. Richardson Jr.
Attorney.

3,067,340

TEMPERATURE COMPENSATING TRANSISTOR SWITCHING CIRCUIT WITH "SNAP-ACTION" RESPONSE

Merwyn E. Hodges, Philadelphia, Pa., assignor to General Electric Company, a corporation of New York Filed May 2, 1960, Ser. No. 25,915
13 Claims. (Cl. 307—88.5)

This invention relates to transistor circuits, and more particularly it relates to a temperature compensated transistor switching circuit designed for "snap-action" response to a variable-magnitude input signal attaining a critical level of magnitude.

When semiconductor components are utilized in electric circuits which must be insensitive to temperature changes, the inherent temperature sensitive characteristics of such components cause special problems. For example, since the collector cut-off current $I_{co}$ of a transistor (referred to hereinafter as the collector leakage current) increases exponentially with increasing ambient temperature, in direct-current amplifier applications of transistors there is an undesirable tendency for the output signal to be dependent on temperature. One known technique for overcoming this undesirable tendency is to provide a temperature stabilizing circuit utilizing at least one semiconductor diode made of the same material as that of the transistor being stabilized, whereby the diode and the collector-base junction of the transistor have the same temperature coefficient of resistance and the two will "track." In accordance with this technique, the stabilizing circuit is so connected in circuit with the amplifier that the effect in the amplifier output of temperature-dependent variations in collector leakage current of the transistor will be neutralized or cancelled by the stabilizing circuit which undergoes corrseponding variations.

Temperature sensitivity is also a problem in designing a transistor circuit which will accurately respond to a predetermined, temperature-independent level of a variable input signal. In this particular application, the transistor must invariably be activated in response to the input quantity attaining its predetermined critical level of magnitude, even though variations in collector leakage current of the transistor due to temperature changes tend to affect the amount of input required for activation. Accordingly, it is a general object of the present invention to provide an improved transistor circuit wherein a transistor actively responds to an input signal attaining a critical magnitude level which will remain substantially constant regardless of temperature changes.

Another object of this invention is to provide a reliable and accurate transistor switching circuit capable of "snap-action" operation in response to a variable input signal attaining a predetermined temperature-independent level of magnitude.

When a transistor switching circuit is supplied by a variable unipolarity input signal having an A.-C. component, there is a tendency for the circuit to produce a pulsing output rather than a continuous one. This may happen when the input signal, between successive peaks thereof, falls below a predetermined "dropout" value required to maintain the transistor in an activated state. Accordingly, it is another object of my invention to provide an improved transistor circuit which, once activated by a D.-C. input signal of appropriate peak magnitude, will remain active for at least a predetermined length of time after the input signal falls below its dropout value.

Still another object of the invention is the provision of a transistor switching circuit capable of producing a continuous output even though energized by an input signal having an A.-C. component.

In carrying out my invention in one form, I provide a transistor circuit comprising a first transistor, a source of D.-C. supply voltage for the transistor, and circuit means for effecting current flow in the emitter-base junction of the transistor in accordance with the magnitude of an input signal of variable magnitude. The circuit means includes current limiting impedance means connected to the base electrode of the first transistor, and the circuit parameters are selected so that the emitter-base junction is forward biased, thereby activating the transistor, whenever the variable input signal attains a predetermined critical level of magnitude. In order that this critical level will be unaffected by variations in the amount of collector leakage current of the first transistor due to temperature changes, I connect the collector-base junction of a second transistor, having substantially the same leakage current versus temperature characteristic as the collector-base junction of the first transistor, to the aforesaid base electrode in parallel with that part of the circuit means in which said leakage current can flow. Both of the collector-base junctions are disposed in polarity agreement with each other, and the second transistor serves to shunt collector leakage current from the emitter-base junction of the first transistor, whereby leakage current variations due to temperature changes have no appreciable effect on the input signal magnitude required to initially forward bias the aforesaid emitter-base junction.

In another aspect of my invention, I provide an energy storing circuit connected in parallel with the collector-base junction of the first-mentioned transistor and arranged to sustain a forward bias current in its emitter-base junction for at least a predetermined length of time under conditions of decreasing conduction in the transistor, whereby deactivation of the transistor circuit is delayed following a reduction of the input signal to a dropout value which would otherwise cause reverse bias of the emitter-base junction.

My invention will be better understood and its various objects and advantages will be more fully appreciated from the following description taken in connection with the accompanying drawing the single FIGURE of which is a schematic circuit diagram of a preferred embodiment of my invention.

Referring now to the drawing, I have illustrated schematically a transistor circuit 11 having a pair of input terminals 12 and a pair of output terminals 13. A load impedance, shown as a resistor 14 for the purposes of the present description, is connected to the output terminals 13, it being understood that the resistor 14 represents any suitable electroresponsive device to be controlled by the transistor circuit.

The transistor circuit 11 is designed to energize effectively the load impedance 14 in response to a variable input signal attaining a predetermined critical level of magnitude. The source of energization for the load impedance is actually provided by a pair of D.-C. supply voltage terminals 15*p* and 15*n* to which a regulated D.-C. supply voltage is applied. Any suitable arrangement may be used to supply this regulated voltage, and in the drawing the voltage source has been illustrated simply in block form at 16.

In its operation the transistor circuit 11 performs as a snap-action switch. Substantially instantaneously in response to the input signal reaching its predetermined critical magnitude level, the transistor circuit turns on or picks up to connect the load impedance 14 to both supply voltage terminals 15*p* and 15*n* through a low impedance path. With the circuit on, at least 85 percent of the supply voltage is applied across the load impedance. The transistor circuit 11 is turned off (drops out) in response to the input signal falling below another predetermined critical level of magnitude, whereupon the connection between the load impedance 14 and the supply voltage terminals is changed to a very high impedance condition thereby effectively deenergizing the load.

The input signal to which the transistor circuit 11 responds is derived from a source shown in block form at 17 for the purpose of illustration. The source 17 of the input signal, which is connected to the input terminals 12, may comprise, for example, a transformer and rectifier arrangement for producing a succession of unipolarity half cycles of voltage representative of an A.-C. quantity of variable amplitude. Thus the variable input signal may have an A.-C. component. The example just given is more fully described in my copending patent application S.N. 76,209, filed on December 16, 1960, and assigned to the assignee of the present invention, where the illustrated transistor circuit 11 is used to perform a level detecting function in a phase comparison protective relaying system.

The transistor circuit 11 is essentially a 2-stage, high gain amplifier with a limited amount of positive feedback. The first stage comprises a PNP germanium transistor 18 whose collector, emitter and base electrodes have been illustrated in the drawing in the conventional manner. It will be apparent to those skilled in the art that an NPN transistor could be used instead of the PNP type shown.

The collector of the transistor 18 is connected to the supply voltage terminal 15*n* through a load impedance comprising the series combination of a coupling resistor 19 and another resistor 20. The emitter of the transistor 18 is connected to the other supply voltage terminal 15*p* through the tapped portion of a potentiometer 22 and a lead 23. The lead 23 will be referred to hereinafter as the reference bus, and in the illustrated embodiment of the invention this bus through terminal 15*p* is connected to the relatively positive pole of the source of D.-C. supply voltage.

The potentiometer 22, which is tapped by an adjustable slider 24, is connected between the reference bus 23 and the relatively negative supply voltage terminal 15*n*. Since the source of D.-C. supply voltage is regulated, the tapped portion of the potentiometer 22, referred to the reference bus 23 and hence terminal 15*p*, provides a source of relatively constant D.-C. bias potential. The slider 24 comprises the negative pole of this source, and its adjustment determines the potential level at the emitter of transistor 18. Whenever the potential of the base electrode of transistor 18 is positive with respect to the slider 24, the transistor is in a cutoff state and the circuit 11 is "dropped out." It will be understood that arrangements other than the illustrated potentiometer 22 could be used as a source of relatively constant D.-C. bias potential, and furthermore that the bias potential might be applied to the base electrode of the transistor instead of to its emitter.

Suitable current limiting impedance means, comprising for example a resistor 25, is connected to the base electrode of the transistor 18. In the preferred embodiment of my invention, as it is illustrated in the drawing, a pair of voltage dividing resistors 26 and 27 are connected across the input terminals 12, and the current limiting resistor 25 is connected to the common terminals of these resistors. A transient suppressing capacitor 28 of relatively small capacitance is also connected across the input terminals 12. As is shown in the drawing, the other terminal of the resistor 27 is connected to the relatively positive input terminal, and both are connected to the reference bus 23. Direct current flowing from the relatively positive to the relatively negative input terminal through resistor 27 causes a voltage drop across this input resistor, and this voltage, which is dependent upon the variable input signal, will be referred to hereinafter as the unipolarity input potential of the transistor circuit 11.

It will be observed at this point that the emitter-base junction of the transistor 18, the tapped portion of the potentiometer 22, the input resistor 27 and the current limiting resistor 25 are serially interconnected to form a control loop circuit, with the common point between the potentiometer 22 and the input resistor 27 comprising the reference bus 23. In the control loop circuit the emitter-base junction has applied across it a unidirectional potential which is responsive to the variable input signal supplied to the transistor circuit 11. The transistor 18 will be activated when its emitter-base junction is forward biased by the conduction of current in the forward direction across this junction, and this occurs whenever the variable input signal attains a level sufficient to cause the unipolarity input potential across resistor 27 to increase (become more negative with respect to the relatively positive reference bus 23) to an appropriate magnitude determined by the setting of slider 24. In other words, activation of the transistor 18 is controlled by the magnitude and polarity of the input potential relative to the bias potential. With no input signal, there is no current flowing from the input terminals 12 through resistor 27, and consequently the potential on the base electrode of transistor 18 is at or near that of the positive reference bus 23.

As long as the base electrode of the transistor 18 is at a potential more positive than that of the slider 24 of the potentiometer 22, the emitter-base junction of the transistor is reverse biased and the transistor is cut off. But even while cut off, leakage current $I_{co}$ will flow across the collector-base junction and through the base electrode of the transistor. Since this collector leakage current flows through resistors 27 and 25, the potential of the base electrode of transistor 18 will be maintained at a level somewhat more negative than the reference bus 23.

Those skilled in the art will realize that the collector leakage current of transistor 18 increases exponentially with rising ambient temperature. If all of the collector leakage current were to flow through the resistors 27 and 25, such variations in its magnitude would cause temperature-dependent variations of the base potential of the transistor 18. Consequently, the bias of the emitter-base junction and hence activation of the transistor 18 would be dependent upon temperature as well as upon the amount of bias potential provided by the tapped portion of the potentiometer 22. Since I want the transistor circuit 11 to respond to a constant and temperature-independent pickup level of the variable input signal, I provide temperature compensating means which will now be described.

To accomplish temperature compensation, a circuit including a semiconductor diode is connected between the base electrode of transistor 18 and the reference bus 23, with the diode being poled in agreement with the collector-base junction of the transistor 18. In other words, a semiconductor diode is disposed in parallel with that part of the control loop circuit in which collector leakage current can flow, and the direction of reverse current flow in the diode corresponds to the direction taken by the collector of transistor 29 is connected directly to the refer- having substantially the same leakage current versus temperature characteristic as the collector junction of transistor 18, and the compensating circuit is arranged, for reasons which will soon be made apparent, to conduct precisely as much leakage current as the collector-base junction is conducting just prior to activation of the transistor.

In accordance with my invention, the above-mentioned semi-conductor diode comprises the collector-base junction of a germanium transistor 29 which has been illustrated in the drawing. Preferably the transistor 29 is an NPN conductivity type connected as shown. The base electrode of the transistor 29 is connected through a base resistor 30 to the base electrode of transistor 18. The collector of transistor 29 is connected directly to the reference bus 23. An adjustable resistor 31 is connected between the emitter of transistor 29 and the base electrode of transistor 18. Transistor 29 is always maintained in a cutoff state in which it performs its compensating function.

The resistance values of the base resistor 30 and the emitter resistor 31 associated with transistor 29 are selected and adjusted so that with the base electrode of transistor 18 at a potential approximately the same as that of slider 24 the collector leakage current of transistor 29 matches the collector leakage current of transistor 18. In other words, just prior to activation of the transistor 18, both of the transistors 18 and 29 are passing leakage currents of equal magnitude, and all of the transistor 18 collector leakage current will be shunted from the input resistor 27 and current limiting resistor 25. Since both transistors 18 and 29 are made of the same semiconductor material, they have the same temperature versus leakage current characteristic, and therefore, the desired condition of matched leakage currents is realized over a wide range of ambient temperatures. It will be apparent, then, that variations in the amount of collector leakage current due to temperature changes have no adverse effect on the unidirectional potential applied to the emitter-base junction of transistor 18, and consequently the desired temperature compensation has been obtained.

The use of the collector-base junction of transistor 29 in the compensating circuit instead of a simple germanium diode offers a practical advantage. The inherent collector leakage current of the NPN type transistor 29 is lower than that of a PNP transistor, and the emitter resistor 31 can be adjusted to increase the leakage current of transistor 29 to a magnitude that is just equal to the collector leakage current of the transistor 18. I have found it advantageous to obtain the desired coordination between the compensating circuit and the transistor 18 by properly adjusting resistor 31 than by selecting a simple germanium diode having precisely the same leakage current as the collector-base junction of the transistor 18. In either case, the important criterion that the diode of the compensating circuit and the collector-base junction of transistor 18 have substantially the same leakage current versus temperature characteristic is satisfied, whereby their respective leakage currents track together over the range of ambient temperatures expected.

In order to ensure that the transistor 18 once activated will not return to its cutoff state for at least a predetermined length of time, I provide a transient negative feedback circuit for this transistor. The feedback circuit will act to delay cutoff or dropout of the transistor circuit 11 whenever the variable input signal decreases to a value which normally is insufficient to sustain the forward bias of the emitter-base junction of transistor 18. Such action is particularly desirable where the input signal has an A.-C. component, since it enables the transistor circuit 11 to remain operative during the intervals between successive peaks of the unipolarity input potential across input resistor 27.

The transient negative feedback circuit mentioned above comprises an energy storing circuit connected in parallel with the collector-base junction of transistor 18, as is shown in the drawing. Preferably the energy storing circuit comprises a capacitor 32 and resistor 33 connected in series with a diode 34 which renders the circuit unilaterally conductive. An additional diode 35 is connected between the energy storing circuit and the reference bus 23 to provide a unilaterally conductive path from capacitor 32 to the positive supply voltage terminal 15*p*.

With the emitter-base junction of transistor 18 forward biased, the transistor is turned on and there is relatively small potential difference between its collector and base electrodes. Consequently, the capacitor 32 of the energy storing circuit is discharged. By changing the potential level of the base electrode of transistor 18 in a positive sense (due to a reduction in the magnitude of the input signal applied to the transistor circuit), a condition of decreasing conduction in the transistor 18 is created, whereupon the collector of the transistor tends to become more negative. The capacitor 32 then begins charging, and in the process of accumulating energy it draws emitter-base current in transistor 18 and sustains a forward bias of the emitter-base junction, whereby conduction by the transistor is sustained for a length of time determined by the time constant of the charging circuit for capacitor 32.

The diodes 34 and 35 associated with the energy storing circuit are provided so that this circuit will be ineffective to delay activation of the transistor 18. With the transistor 18 in a cutoff state, there is a substantial potential difference between its collector and base electrodes and the capacitor 32 of the energy storing circuit is charged. Discharge of the energy stored in capacitor 32 through the current limiting resistor 25 is blocked by the diode 34 as the potential on the base electrode of transistor 18 becomes more negative in response to an increasing input signal. As the emitter-base junction of transistor 18 becomes forward biased and conduction begins to increase, the potential at the collector of the transistor becomes more positive. Under such conditions the energy stored in capacitor 32 is dissipated through the path provided by the diode 35, and the energy storing circuit effects no delay in the activation of transistor 18.

The second or output stage of the transistor circuit 11, as can be seen in the drawing, comprises another transistor 36 the base electrode of which is connected to the coupling resistor 19. Preferably transistor 36 is an NPN type, and its collector is connected through a resistor 37 of relatively small resistance to one of the output terminals 13. The load impedance 14 is connected between resistor 37 and the other output terminal which is maintained at the potential of the relatively positive reference bus 23. The emitter of transistor 36 is connected to the relatively negative supply voltage terminal 15*n* through a pair of series connected silicon diodes 38 poled in agreement with the emitter-base junction of this transistor.

In response to activation of the transistor 18, collector current flowing through resistor 19 divides between resistor 20 and the forward impedances of the emitter-base junction of transistor 36 and the two series connected diodes 38. The current through the emitter-base junction of transistor 36 is sufficient to bias the transistor into a state of full conduction. Since resistor 37 is of relatively small resistance, upon operation of transistor 36 nearly the full amount of the supply voltage is applied across the load impedance 14 for the effective energization thereof.

The silicon diodes 38 are provided in the emitter circuit of transistor 36 to ensure that this transistor does not operate as a result of leakage current. There are two aspects to the performance of this function by the diodes. Since a silicon diode inherently presents a relatively high impedance to the passage of a small quantity of forward current, the greater portion of collector leakage current of transistor 36 prefers to follow the parallel path through base resistor 20 thereby avoiding amplification which would take place if it were able to follow a path through the emitter-base junction of the transistor. Furthermore, because of the forward voltage drops of the series connected diodes 38 caused by the small portion of collector leakage current which flows out of the emitter of transistor 36, the emitter-base junction of this transistor will remain reverse biased even though its base electrode is somewhat positive with respect to the supply voltage terminal 15*n* due to the flow of leakage currents of both transistors 18 and 36 through resistor 20.

The interconnections between the two transistors 18 and 36 include positive feedback arranged so that the forward bias of the emitter-base junction of transistor 18 is enhanced upon operation of the transistor 36. Preferably the positive feedback means comprises a circuit including an adjustable resistor 39 and another resistor 40 connected between the collector of transistor 36 and the junction of resistors 25 and 27. As the transistor 36 begins operating and its collector current rises above cutoff level, increasing current drawn through the input resistor 27 and the feedback circuit 39, 40 produces additional voltage across resistor 27, thereby increasing the negative potential on the base electrode of transistor 18 and hence augmenting conduction in the emitter-base junction thereof. The resulting cumulative action promptly gives rise to full conduction by the output transistor 36.

The parameters of the positive feedback circuit are selected so that only a limited amount of feedback current is drawn through input resistor 27. This enables the desired snap-action operation of the transistor circuit 11 to be obtained without a resultant loss of control over deactivation of the transistor circuit by the variable input signal applied to the input terminals 12. By appropriately adjusting the resistor 39 in the feedback circuit, the circuit 11 can be arranged so that the emitter-base junction of transistor 18 will become reverse biased and the circuit will return to a cutoff state in response to the variable input signal attaining a predetermined dropout value which can be any desired percentage of its predetermined critical pickup level. Of course, such deactivation is realized only with time delay due to the transient negative feedback circuit 32—34 described hereinbefore.

In one successful application of the transistor circuit 11 illustrated in the drawing, the various circuit parameters were selected in accordance with the table set forth below. It will be understood, of course, that this table is representative only and parameters other than those indicated may be used with equal success.

| | | |
|---|---|---|
| Transistor 18 | | 2N525 |
| Transistor 29 | | 2N634 |
| Transistor 36 | | 2N167 |
| Supply voltage | volts | 26 |
| Potentiometer 22 | ohms | 2,000 |
| Resistor 19 | do | 10,000 |
| Resistor 20 | do | 4,700 |
| Resistor 25 | do | 10,000 |
| Resistor 26 | do | 10,000 |
| Resistor 27 | do | 10,000 |
| Resistor 30 | do | 4,700 |
| Rheostat 31 | do | 5,000 |
| Resistor 33 | do | 10,000 |
| Resistor 37 | do | 470 |
| Rheostat 39 | do | 250,000 |
| Resistor 40 | do | 47,000 |
| Capacitor 28 | microfarads | .01 |
| Capacitor 32 | do | .05 |

A load impedance (resistor 14) of about 4,700 ohms was used, and the variable input signal had an A.-C. component superimposed upon a direct current component. With the slider 24 of potentiometer 22 adjusted to give a bias potential of three volts, the transistor circuit 11 operated in response to the input signal attaining the critical peak magnitude of eight volts. This predetermined pickup level of the input signal was maintained constant in spite of temperature changes within the range of —20 to +55 degrees centigrade. The load impedance was effectively energized within less than 0.1 millisecond in response to the input signal being abruptly increased from zero to 1.2 times its pickup level, and the dropout of the transistor circuit was delayed by 2.5 milliseconds following reduction of the input signal to zero from 1.2 times pickup.

From the foregoing detailed description of the circuitry of the transistor circuit 11, its mode of operation may readily be followed. Normally the variable input signal applied to the input terminals 12 is of insufficient magnitude to activate the circuit, and both transistors 18 and 36 are cut off. As a result, the collector-emitter circuit of transistor 36 is in a high impedance condition and the load 14 is not effectively energized.

As the input signal for the circuit 11 increases in magnitude, the unipolarity potential across resistor 27 in the control loop circuit increases negatively with respect to the reference bus 23. The emitter-base junction of the transistor 18 becomes forward biased when the input signal attains its critical pickup level as determined by the amount of the relatively constant D.-C. bias potential provided by the tapped portion of potentiometer 22. As a result, forward current conduction is initiated in the emitter-base junction, and transistor 18 is activated.

The temperature compensating circuit, including transistor 29, connected across the control loop circuit shunts collector leakage current of transistor 18 from the current limiting resistor 25 and the input resistor 27. Since the temperature versus leakage current characteristic of the compensating circuit is substantially the same as that of the collector-base junction of transistor 18, the compensating circuit accommodates all variations in leakage current due to temperature changes and the pickup level of the input signal to which the transistor circuit 11 operably responds is insensitive to such temperature changes.

The current through resistor 19 resulting from the activation of transistor 18 flows partially through the emitter-base junction of transistor 36 thereby causing transistor 36 to conduct and its emitter-collector circuit to change to a low impedance condition. This effectively connects the load 14 across the supply voltage terminals 15*p* and 15*n* for energization by the supply voltage. Current drawn through input resistor 27 by the positive feedback circuit 39, 40 complements the unipolarity input potential in the control loop circuit of transistor 18, whereby conduction in the emitter-base junction of transistor 18 is augmented and a positive, snap-action operation of the transistor switching circuit 11 is obtained.

Whenever the input signal applied to the transistor circuit 11 is reduced below a predetermined dropout value, the net potential across the input resistor 27 tends to fall to a value causing reverse bias of the emitter-base junction of transistor 18. The resulting decrease in conduction by transistor 18 is necessarily accomplished by an accumulation of energy by capacitor 32 in the energy storing circuit connected across the collector-base junction of this transistor, and as a result current is drawn through the emitter-base junction of transistor 18. This sustains conduction in transistor 18 and delays deactivation or dropout of circuit 11, whereby continuous energization of the load 14 can be realized even though the input signal momentarily falls below its predetermined dropout value between successive peaks of the A.-C. component thereof.

While I have shown and described a preferred form of my invention by way of illustration, many modifications will occur to those skilled in the art. I contemplate, therefore, by the claims which conclude this specification to cover all such modifications as fall within the true spirit and scope of my invention.

What I claim as new and desire to secure by U.S. Letters Patent is:

1. In a transistor circuit responsive to an input signal of variable magnitude attaining a predetermined critical magnitude level: a PNP transistor comprising a collector, emitter and base electrode; a source of D.-C. supply voltage for said transistor; a load impedance connected in circuit with said transistor for effective energization by the supply voltage upon activation of said transistor; current limiting impedance means connected to the base electrode of said transistor; circuit means, including the current limiting impedance means, for applying to the emitter-base junction of the PNP transistor a potential dependent on the difference between a unipolarity input potential responsive to the variable input signal and a relatively constant D.-C. bias potential, whereby the initiation of current conduction in said emitter-base junction and hence activation of the PNP transistor is controlled by the magnitude and polarity of the input potential relative to the bias potential; an NPN transistor comprising a collector, emitter and base electrode; the base electrode of said NPN transistor being coupled to the base electrode of said PNP transistor and the collector of said NPN transistor being connected in parallel with that part of said circuit means, including the current limiting impedance means, in which collector leakage current of said PNP transistor can flow; and adjustable impedance means connected between the emitter of said NPN transistor and the base electrode of said PNP transistor to control the magnitude of collector leakage current of said NPN transistor, said adjustable impedance means being adjusted so that all of the collector leakage current of said PNP transistor is shunted from said current limiting impedance means by said NPN transistor, whereby the critical input signal level which causes activation of said PNP transistor will be unaffected by variations in the amount of leakage current due to temperature changes.

2. In a transistor circuit responsive to an input signal of variable magnitude attaining a predetermined critical magnitude level: a pair of D.-C. supply voltage terminals; a PNP transistor comprising a collector, emitter and base electrode; means connecting said collector to one of said terminals; current limiting impedance means connected to said base electrode; means connecting the current limiting impedance means to a source of unipolarity input potential referred to the other terminal of said pair of supply voltage terminals, the input potential being dependent upon the variable input signal; means connecting said emitter to a source of relatively constant D.-C. bias potential referred to said other supply voltage terminal; an NPN transistor comprising a base electrode, collector, and emitter which is connected to said other supply voltage terminal, the NPN transistor being made of the same material as said PNP transistor; means interconnecting the base electrodes of both of said transistors; and adjustable impedance means connected between the emitter of said NPN transistor and the base electrode of said PNP transistor for adjusting the collector leakage current of the NPN transistor to match the collector leakage current of said PNP transistor.

3. In a temperature compensated transistor switching circuit operable in response to the attainment by a variable input signal of a predetermined critical level of magnitude: load impedance to be energized upon operation of the switching circuit; a pair of D.-C. supply voltage terminals; first and second transistors each having a collector, base and emitter; an emitter-collector circuit, including the supply voltage terminals, for the first transistor; an emitter-collector circuit for the second transistor comprising the supply voltage terminals and the load impedance; an emitter-base circuit for the second transistor coupled to the emitter-collector circuit of said first transistor in a manner so that forward current conduction in said emitter-base circuit, and hence operation of the second transistor, is effected in response to activation of the first transistor; current limiting impedance means; a source of unipolarity input potential dependent upon the variable input signal; a source of relatively constant D.-C. bias potential; an emitter-base circuit for the first transistor comprising the current limiting impedance means and the sources of input and bias potentials serially interconnected so that the initiation of current conduction in the emitter-base junction of said first transistor, and hence activation of the first transistor, is controlled by the magnitude and polarity of the input potential relative to the bias potential; a third transistor of a conductivity type opposite to that of said first transistor, said third transistor including a collector-base junction having substantially the same temperature versus leakage current characteristic as the collector-base junction of the first transistor, the collector-base junction of the third transistor being connected to the first transistor base electrode in parallel circuit relationship with that part of the first transistor emitter-base circuit, including said current limiting impedance means, in which collector leakage current of the first transistor can flow and being disposed in polarity agreement with the collector-base junction of the first transistor so that collector leakage current is shunted from said current limiting impedance means by said third transistor, whereby the critical input signal level which causes activation of said first transistor will be unaffected by variations in the amount of said leakage current due to temperature changes; and positive feedback means coupling the emitter-collector circuit of the said second transistor to the emitter-base circuit of the first transistor in a manner so that current conduction in the emitter-base junction of the first transistor is augmented upon operation of the second transistor.

4. In a temperature compensated transistor switching circuit operable in response to the attainment by a variable input signal of a predetermined critical level of magnitude: a pair of D.-C. supply voltage terminals; a first transistor comprising a collector, emitter and base electrode; means connecting the collector of said first transistor to one of said supply voltage terminals; current limiting impedance means connected to the base electrode of said first transistor; a source of unipolarity input potential dependent upon the variable input signal; a source of relatively constant D.-C. potential; means serially interconnecting the emitter-base junction of said first transistor, the current limiting impedance means, the source of input potential, and the source of bias potential to form a loop circuit, with a common point between said potential sources being connected to the other terminal of said pair of supply voltage terminals, whereby the initiation of current conduction in the emitter-base junction of said first transistor, and hence activation of the first transistor, is controlled by the magnitude and polarity of the input potential relative to the bias potential; a second transistor coupled to the supply voltage terminals and to said first transistor for operation in response to activation of the first transistor; a positive feedback circuit interconnecting the second transistor and said source of input potential for augmenting conduction in the emitter-base junction of said first transistor in response to operation of the second transistor; and a third transistor comprising a collector, emitter and base electrode; the collector-base junction of said third transistor, in polarity agreement with the collector-base junction of said first transistor, being connected to the base electrode of said first transistor in parallel circuit relationship with that part of said loop circuit, including said current limiting impedance means, in which the collector leakage current of said first transistor can flow, whereby collector leakage current of said first transistor will be shunted from said current limiting impedance means by the collector-base junction of said third transistor.

5. In a transistor circuit: a transistor having a collector, emitter and base electrode; a source of D.-C. supply voltage for the transistor; a load impedance connected in circuit with the transistor for effective energization by the supply voltage upon activation of the transistor; circuit means for applying a unidirectional potential to the emitter-base junction of the transistor to initiate current conduction in said emitter-base junction, thereby activating the transistor; means for ensuring that the transistor remains activated for at least a predetermined length of time comprising a unilaterally conductive electric energy storing circuit connected in parallel with the collector-base junction of the transistor to draw emitter-base current, and hence sustain conduction, while accumulating energy under conditions of decreasing conduction in the transistor; and a diode connected between said energy storing circuit and the supply voltage source to provide a path for dissipating energy stored in the energy storing circuit under conditions of increasing conduction in the transistor, whereby the energy storing circuit is ineffective to delay activation of the transistor.

6. The transistor circuit of claim 5 in which the unilaterally conductive energy storing circuit comprises a capacitor and a resistor in series with another diode.

7. In a transistor switching circuit: first and second transistors each having a collector, emitter and base electrode; a source of D.-C. supply voltage for both transistors; means for activating the first transistor comprising a source of unipolarity input potential of variable magnitude and a source of relatively constant D.-C. bias potential, said sources and the emitter-base junction of the first transistor being serially interconnected to form a loop circuit in which the initiation of the current conduction, and hence activation of the first transistor, is controlled by the magnitude and polarity of the input potential relative to the bias potential; a load impedance connected in circuit with the second transistor for energization by the supply voltage upon operation of the second transistor; said first and second transistors being respectively interconnected with positive feedback so that the second operates in response to activation of the first and conduction in the emitter-base junction of the first is augmented upon operation of the second; and means for ensuring that the first transistor remains activated for at least a predetermined length of time comprising an electric energy storing circuit connected in parallel with the collector-base junction of the first transistor to draw emitter-base current, and hence sustain conduction, while accumulating energy under conditions of decreasing conduction in the first transistor.

8. In a transistor switching circuit: first and second transistors each having a collector, emitter and base electrode; a source of D.-C. supply voltage for both transistors; circuit means for applying to the emitter-base junction of the first transistor a unidirectional potential having an A.-C. component, the peak magnitude of said potential being sufficient to initiate current conduction in said emitter-base junction and thereby activate the first transistor; a load impedance connected in circuit with the second transistor for energization by the supply voltage upon operation of the second transistor; said first and second transistors being respectively interconnected with positive feedback so that the second operates in response to activation of the first and current conduction in the emitter-base junction of the first is augmented upon operation of the second; and means for ensuring that the first transistor remains activated during the intervals between successive peaks of said unidirectional potential comprising an electric energy storing circuit connected in parallel with the collector-base junction of the first transistor to sustain a forward bias of the emitter-base junction of the first transistor for at least a predetermined length of time under conditions of decreasing conduction in the first transistor.

9. In a transistor switching circuit; first and second transistors each having a collector, emitter and base electrode; a source of D.-C. supply voltage for both transistors; means for activating the first transistor comprising a source of unipolarity input potential of variable magnitude and a source of relatively constant D.-C. bias potential, said sources and the emitter-base junction of the first transistor being serially interconnected to form a loop circuit in which the initiation of current conduction, and hence activation of the first transistor, is controlled by the magnitude and polarity of the input potential relative to the bias potential; a load impedance connected in circuit with the second transistor for energization by the supply voltage upon operation of the second transistor; said first and second transistors being respectively interconnected with positive feedback so that the second operates in response to activation of the first and conduction in the emitter-base junction of the first is augmented upon operation of the second; and means for ensuring that the first transistor remains activated for at least a predetermined length of time comprising a unilaterally conductive circuit including a resistor and a capacitor connected in series across the collector-base junction of the first transistor to draw emitter-base current; and hence sustain conduction, while said capacitor is charging under conditions of decreasing conduction in the first transistor.

10. In a temperature compensated transistor switching circuit operable in response to the attainment by a variable input signal of a predetermined critical level of magnitude; first and second transistors each having a collector, emitter and base electrode; a source of D.-C. supply voltage for both transistors; current limiting impedance means connected to the base electrode of the first transistor; circuit means, including the current limiting impedance means, for effecting current flow in the emitter-base junction of said first transistor in accordance with the magnitude of the variable input signal, the parameters of said circuit means being selected so that said emitter-base junction becomes forward biased, thereby activating the first transistor, whenever the input signal attains said predetermined critical magnitude level; a load impedance connected in circuit with the second transistor for energization by the supply voltage upon operation of the second transistor; said first and second transistors being respectively interconnected with positive feedback so that the second operates in response to activation of the first and the forward bias of the emitter-base junction of the first is enhanced upon operation of the second; a semiconductor diode, having substantially the same temperature versus leakage current characteristic as the collector-base junction of said first transistor, connected to the base electrode of the first transistor in parallel circuit relationship with that part of said circuit means, including the current limiting impedance, in which collector leakage current of the first transistor can flow, said diode being poled in agreement with said collector-base junction so that said collector leakage current is shunted from the current limiting impedance means by said diode, whereby the critical input signal level which causes activation of the first transistor will be unaffected by variations in the amount of said leakage current due to temperature changes; and means for delaying deactivation of the first transistor comprising an electric energy storing circuit connected in parallel with the collector-base junction of said first transistor to sustain a forward bias of the emitter-base junction of the first transistor for at least a predetermined length of time under conditions of decreasing conduction in the first transistor, whereby continuous energization of said load impedance is realized as long as the variable input signal does not fall below a level required to forward bias the emitter-base junction of said first transistor for longer than said predetermined length of time.

11. In a transistor circuit responsive to an input signal of variable magnitude attaining a predetermined critical magnitude level: a pair of D.-C. supply voltage terminals; a first transistor comprising a collector, emitter and base electrode; means connecting said collector to one of said terminals; current limiting impedance means connected to said base electrode; a source of unipolarity input voltage dependent upon the variable input signal; a source of relatively constant D.-C. bias voltage; means serially interconnecting the emitter-base junction of the first transistor, the current limiting impedance means, the source of input voltage, and the source of bias voltage to form a loop circuit, with a common point between said voltage sources being connected to the other terminal of said pair of supply voltage terminals, whereby the initiation of current conduction in said loop circuit and hence activation of the first transistor is controlled by the magnitude and polarity of the input voltage relative to the bias voltage; and a second transistor including a collector-base junction having substantially the same temperature versus leakage current characteristic as the collector-base junction of said first transistor, the collector-base junction of the second transistor being connected to said base electrode in parallel circuit relationship with that part of said loop circuit, including said current limiting impedance means, in which collector leakage current of the first transistor can flow and being disposed in polarity agreement with the collector-base junction of the first transistor, whereby the critical input signal level which causes activation of the first transistor will be unaffected by variation in the amount of its collector leakage current due to temperature changes.

12. In a temperature compensated transistor switching circuit operable in response to the attainment by a variable input signal of a predetermined critical level of magnitude: first and second transistors each comprising a collector, emitter and base electrode; a source of D.-C. supply voltage for both transistors; current limiting impedance means connected to the base electrode of the first transistor; circuit means, including the current limiting impedance means, for effecting current flow in the emitter-base junction of said first transistor in accordance with the magnitude of the variable input signal, the parameters of said circuit means being selected so that said emitter-base junction becomes forward biased, thereby activating the first transistor, whenever the input signal attains said predetermined critical magnitude level; a load impedance connected in circuit with the second transistor for energization by the supply voltage upon operation of the second transistor; said first and second transistors being respectively interconnected with positive feedback so that the second operates in response to activation of the first and the forward bias of the emitter-base junction of the first is enhanced upon operation of the second; and a third transistor including a collector-base junction having substantially the same temperature versus leakage current characteristic as the collector-base junction of said first transistor, the collector-base junction of the third transistor, in polarity agreement with the collector-base junction of said first transistor, being connected to the base electrode of the first transistor in parallel circuit relationship with that part of said circuit means, including the current limiting impedance means, in which collector leakage current of the first transistor can flow, whereby collector leakage current of the first transistor is shunted from the current limiting impedance means by the collector-base junction of said third transistor and the critical input signal level which causes activation of the first transistor will be unaffected by variations in the amount of said leakage current due to temperature changes.

13. In a transistor circuit: first and second transistors each having a collector, emitter and base electrode; a source of D.-C. supply voltage for both transistors; circuit means for applying to the emitter-base junction of the first transistor a unidirectional input signal of sufficient magnitude to initiate current conduction in said emitter-base junction and thereby activate the first transistor; a load impedance connected in circuit with the collector of the second transistor for energization by the supply voltage upon activation of the second transistor; said first and second transistors being so interconnected that the second is activated in response to activation of the first; means for ensuring that the first transistor remains activated for at least a predetermined length of time comprising a unilaterally conductive electric energy storing circuit connected in parallel with the collector-base junction of the first transistor to sustain emitter-base conduction while accumulating energy under conditions of decreasing conduction in the first transistor; and a diode connected between said energy storing circuit and the supply voltage source to provide a path for dissipating energy stored in the energy storing circuit under conditions of increasing conduction in the first transistor, whereby the energy storing circuit is ineffective to delay activation of the first transistor.

References Cited in the file of this patent

UNITED STATES PATENTS

| | | |
|---|---|---|
| 2,831,126 | Linville et al. | Apr. 15, 1958 |
| 2,858,456 | Royer et al. | Oct. 28, 1958 |
| 2,877,310 | Donald | Mar. 10, 1959 |
| 2,892,165 | Lindsay | June 23, 1959 |
| 2,961,553 | Giger | Nov. 22, 1960 |